(12) United States Patent
Verstraeten et al.

(10) Patent No.: US 11,385,551 B2
(45) Date of Patent: Jul. 12, 2022

(54) METHOD FOR PROCESS METROLOGY

(71) Applicant: ASML NETHERLANDS B.V., Veldhoven (NL)

(72) Inventors: Bert Verstraeten, Lommel (BE); Hugo Augustinus Joseph Cramer, Eindhoven (NL); Thomas Theeuwes, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 576 days.

(21) Appl. No.: 16/330,417

(22) PCT Filed: Aug. 16, 2017

(86) PCT No.: PCT/EP2017/070763
§ 371 (c)(1),
(2) Date: Mar. 5, 2019

(87) PCT Pub. No.: WO2018/046265
PCT Pub. Date: Mar. 15, 2018

(65) Prior Publication Data
US 2021/0302845 A1   Sep. 30, 2021

(30) Foreign Application Priority Data
Sep. 12, 2016 (EP) ................................ 16188370

(51) Int. Cl.
*G03F 7/20* (2006.01)
(52) U.S. Cl.
CPC ...... *G03F 7/70625* (2013.01); *G03F 7/70641* (2013.01)

(58) Field of Classification Search
CPC ............ G03F 7/70625; G03F 7/70641; G03F 7/70508; G03F 7/70683
(Continued)

(56) References Cited

U.S. PATENT DOCUMENTS

| 2005/0185174 A1 | 8/2005 | Van Der Laan et al. |
| 2006/0167651 A1 | 7/2006 | Zangooie et al. |

(Continued)

FOREIGN PATENT DOCUMENTS

| CN | 1947062 | 4/2007 |
| EP | 1721218 A1 | 11/2006 |

(Continued)

OTHER PUBLICATIONS

Korean Office Action issued in corresponding Korean Application No. 10-2009-7010536, dated Sep. 22, 2020.

(Continued)

*Primary Examiner* — Hung V Nguyen
(74) *Attorney, Agent, or Firm* — Pillsbury Winthrop Shaw Pittman LLP

(57) ABSTRACT

A method of evaluating a patterning process, the method including: obtaining the result of a first measurement of a first metrology target; obtaining the result of a second measurement of a second metrology target, the second metrology target having a structural difference from the first metrology target that generates a sensitivity difference and/or an offset, of a process parameter of the patterning process between the first and second metrology targets; and determining a value pertaining to the patterning process based on the results of the first and second measurements.

21 Claims, 13 Drawing Sheets

(58) Field of Classification Search
USPC .................................................. 355/52, 55
See application file for complete search history.

(56) References Cited

U.S. PATENT DOCUMENTS

| | | | |
|---|---|---|---|
| 2011/0003256 A1 | 1/2011 | Van Der Heijden et al. | |
| 2011/0027704 A1 | 2/2011 | Cramer et al. | |
| 2011/0043791 A1 | 2/2011 | Smilde et al. | |
| 2011/0249247 A1 | 10/2011 | Cramer et al. | |
| 2012/0242970 A1 | 9/2012 | Smilde et al. | |
| 2013/0116978 A1 | 5/2013 | Yoo et al. | |
| 2018/0252998 A1* | 9/2018 | Ten Berge | G03F 1/72 |
| 2018/0284623 A1* | 10/2018 | Tel | G03F 7/70641 |

FOREIGN PATENT DOCUMENTS

| | | |
|---|---|---|
| KR | 10-2007-0019690 | 2/2007 |
| TW | I1266042 | 11/2006 |
| TW | 201333416 | 8/2013 |
| WO | 2005081069 | 9/2005 |
| WO | 2009078708 | 6/2009 |
| WO | 2009106279 | 9/2009 |
| WO | 2012126684 | 9/2012 |
| WO | 2013067064 | 5/2013 |

OTHER PUBLICATIONS

Chinese Office Action issued in corresponding Chinese Application No. 2017800556461, dated Jun. 28, 2020.
International Search Report and Written Opinion issued in corresponding PCT Patent Application No. PCT/EP2017/070763, dated Nov. 9, 2017.
Taiwanese Office Action issued in corresponding Taiwanese Patent Application No. 106130714, dated Nov. 28, 2018.
Taiwanese Office Action issued in corresponding Taiwanese Patent Application No. 106130714, dated Aug. 17, 2018.
Taiwanese Office Action issued in corresponding Taiwanese Patent Application No. 106130714, dated Jul. 26, 2019.
Korean Office Action issued in corresponding Korean Patent Application No. 10-2021-7010536, dated Aug. 10, 2021.

* cited by examiner

METHOD FOR PROCESS METROLOGY

CROSS-REFERENCE TO RELATED APPLICATIONS

This application is the U.S. national phase entry of PCT patent application no. PCT/EP2017/070763, which was filed on Aug. 16, 2017, which claims the benefit of priority of European patent application no. 16188370.7, which was filed on Sep. 12, 2016 and which is incorporated herein in its entirety by reference.

FIELD

The present disclosure relates to methods and apparatus for metrology usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a patterning process (i.e., a process of creating a device or other structure involving patterning (such as lithographic exposure or imprint), which may typically include one or more associated processing steps such as development of resist, etching, etc.), it is desirable to determine (e.g., measure, simulate using one or more models that model one or more aspects of the patterning process, etc.) one or more parameters of interest, such as the critical dimension (CD) of a structure, the overlay error between successive layers formed in or on the substrate (i.e., a measure of the accuracy of alignment of two layers in a device, such that, for example, a measured overlay of 1 nm may describe a situation where two layers are misaligned by 1 nm), focus used to expose a structure, a dose of radiation used to expose a structure, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure focus, dose, overlay, etc.

Various forms of inspection apparatus (e.g., metrology apparatus) have been developed for use in the lithographic field. These devices direct a beam of radiation onto a target and measure one or more properties of the redirected (e.g., scattered and/or reflected) radiation—e.g., intensity at a single angle of reflection as a function of wavelength; intensity of different diffraction orders (e.g., zero, $+1^{st}$ and/or $-1^{st}$ orders); intensity at one or more wavelengths as a function of reflected angle; or polarization as a function of reflected angle—to obtain data from which a property of interest of the target can be determined. Determination of the property of interest may be performed by various techniques: e.g., reconstruction of the target by iterative approaches such as rigorous coupled wave analysis or finite element methods; library searches; and principal component analysis.

In an embodiment, structures measured are denoted as targets. The targets used by inspection apparatus (e.g., a scatterometer) are relatively large, e.g., 40 μm by 40 μm, periodic structures (e.g., gratings) and the measurement beam generates a spot that is smaller than the periodic structure (i.e., the periodic structure is underfilled). This simplifies mathematical determination of a parameter of interest from the target as it can be regarded as infinite. However, in order to reduce the size of the targets, e.g., to 10 μm by 10 μm or less, e.g., so they can be positioned in amongst product features, rather than in the scribe lane, metrology has been proposed in which the periodic structure is made smaller than the measurement spot (i.e., the periodic structure is overfilled). Such targets can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety.

Using a known metrology technique, an overlay measurement result is obtained by measuring a target twice under certain conditions, while rotating the target or changing the illumination or imaging mode to obtain separately the $-1^{st}$ and the $+1^{st}$ diffraction order intensities. Comparing these intensities for a given grating provides a measurement of asymmetry in the grating. Asymmetry in a pair of stacked periodic structures of the target can be used as an indicator of overlay error.

Similarly, structural asymmetry of a focus-sensitive periodic structure can yield an intensity asymmetry that can be used as an indicator of defocus. U.S. patent application publication no. US 2011-0249247 discloses using measured scatterometer signals from focus-sensitive asymmetric target designs to measure defocus of a lithographic apparatus. The entire contents of that application are incorporated herein by reference. In such a method, asymmetric information, as available in the inspection apparatus pupil in the form of the difference between $-1^{st}$ and $+1^{st}$ diffraction order intensities, is used to infer exposure defocus from the measured inspection apparatus signals.

SUMMARY

In order to, for example, maintain a good yield of a patterning process, it is desired to control the absolute location of a product feature in its process window (i.e., a space of a plurality of process parameters of interest (e.g. exposure dose and focus) under which the feature will be produced within specification (e.g., within 15%, within 10%, or within 5% of a design value of a process parameter (e.g., nominal value of CD)). To achieve this control, one should have combination of calibrated measurements of each of the plurality of process parameters. The discussion hereafter will consider focus and dose as the process parameters of interest, but as will be appreciated the process parameters can include one or both of focus and dose along with one or more other process parameters, or comprise a plurality of process parameters other than dose and focus. So, in an embodiment where the process parameters of interest are dose and focus, one should have a combination of a calibrated focus measurement (e.g., a metrology system that determines on-product focus) and a calibrated dose measurement (e.g., a metrology system that determines on-product dose using, e.g., optical critical dimension (CD) measurement) to independently map the focus and dose values.

There are several techniques to measure focus. For example, a technique can be used that measures the on-product focus setting of an exposure apparatus, aiming to characterize, monitor and/or improve the focus performance of the apparatus and desirably control the yield of the product. For this, in an embodiment, one or more dedicated asymmetric focus targets are employed that allow separation of focus information from other process information. In an embodiment, the target comprises a grating wherein the line/space has a pitch comparable to the wavelength of the inspection apparatus (350-900 nm) so that the asymmetry can be detected in the first diffraction orders of the inspection system pupil. In an embodiment, the target comprises sub-resolution features (e.g., that extend from the lines of the grating) to introduce asymmetry in the line-space profile. In an embodiment, a dark-field detection method is used so that small targets (e.g., 10 µm×10 µm) can be used to monitor intra-field focus.

The effective exposure dose, arising from the combination of exposure apparatus, patterning device and processing, is typically measured through line width (critical dimension, CD) of structures. Inspection apparatuses used for such measurements include a CD-SEM (Scanning Electron Microscope) and/or a scatterometer. That is, effective dose is typically inferred from CD measurement, e.g. optical CD (OCD). In an embodiment, this involves a reconstruction of the inspection system signal to infer a dose value that was used to expose the OCD target (e.g., a periodic structure (e.g., lines/spaces) and/or a contact hole type structure). To enable reconstruction, a significant amount of data (e.g. materials properties of the layers (e.g., refractive index, extinction coefficient, etc. of single- and multi thin films making up the target, nominal values for the geometrical dimensions, metrology data (e.g., SEM data), etc.) will typically be needed to enable the reconstruction from the inspection signal to a dose value.

Then, to enable the control, an appropriate process window (e.g., the focus and dose conditions that give a generally defect free patterning, e.g., patterning within a desired tolerance) should be identified. This can be done by simulation and/or experimental verification.

For a focus-sensitive periodic structure, any effect that leads to an asymmetry change in the inspection apparatus pupil will be attributed to defocus. One such effect is that of exposure dose. Thus, exposure dose variation can affect defocus measurement. Moreover, exposure dose can be difficult to measure, particularly with, e.g., small in-die targets.

Further, the pitch of an optical focus measurement target may be non-compliant with design rules for the product pattern. Thus, a metrology target with a pitch closer to a product pitch is desired. It is also desirable, for example, that a target be relatively small (e.g., smaller than 1515 µm$^2$).

Additionally, it is desirable, for example, that stack information and recipe development be avoided. Thus, in an embodiment, it is desirable that dose information be derived without requiring reconstruction.

It is also desirable, for example, to provide a metrology technique that can directly indicate the risk of decreasing yield of the critical structures (i.e., structures tending to defect more than other, and also known as hotspots) in a product design.

In an embodiment, there is provided a method of evaluating a patterning process, the method comprising: obtaining the result of a first measurement of a first metrology target; obtaining the result of a second measurement of a second metrology target, the second metrology target having a structural difference from the first metrology target that generates a sensitivity difference and/or an offset, of a process parameter of the patterning process between the first and second metrology targets; and determining, by a computer system, a value pertaining to the patterning process based on the results of the first and second measurements.

In an embodiment, there is provided a method of evaluating a patterning process, the method comprising: obtaining a result of measurement of a pattern target; determining, by a computer system, a value pertaining to the patterning process based on a combination of the result of the measurement of the pattern target with a result of measurement of a first auxiliary metrology target and a result of measurement of a second auxiliary metrology target, the second auxiliary metrology target having a structural difference from the first auxiliary metrology target that generates a sensitivity difference and/or an offset, of a process parameter of the patterning process between the first and second auxiliary metrology targets.

In an embodiment, there is provided a method of generating a set of metrology targets to evaluate a patterning process, the method comprising: obtaining a pattern target; and generating, by a computer system, a first metrology target from the pattern target, the first metrology target having a structural difference from the pattern target that generates a sensitivity difference and/or an offset, of a process parameter of the patterning process between the pattern target and the first metrology target such that a Bossung curve measured for the first metrology target is shifted from a Bossung curve measured for the pattern target.

In an embodiment, there is provided a set of metrology targets to evaluate a patterning process, the set of metrology targets comprising a first metrology target and a second metrology target, a difference between the first metrology target and the second metrology target generating a sensitivity difference and/or an offset, of a process parameter of the patterning process between the first and second metrology targets.

In an embodiment, there is provided a metrology apparatus for measuring a parameter of a patterning process, the metrology apparatus being operable to perform a method as described herein.

In an embodiment, there is provided a non-transitory computer program product comprising machine-readable instructions for causing a processor to cause performance of a method as described herein.

In an embodiment, there is provided a system comprising: an inspection apparatus configured to provide a beam of radiation on a metrology target and to detect radiation redirected by the target to determine a parameter of a patterning process; and a non-transitory computer program product as described herein.

In an embodiment, the system further comprises a lithographic apparatus comprising a support structure configured to hold a patterning device to modulate a radiation beam and a projection optical system arranged to project the modulated radiation beam onto a radiation-sensitive substrate.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
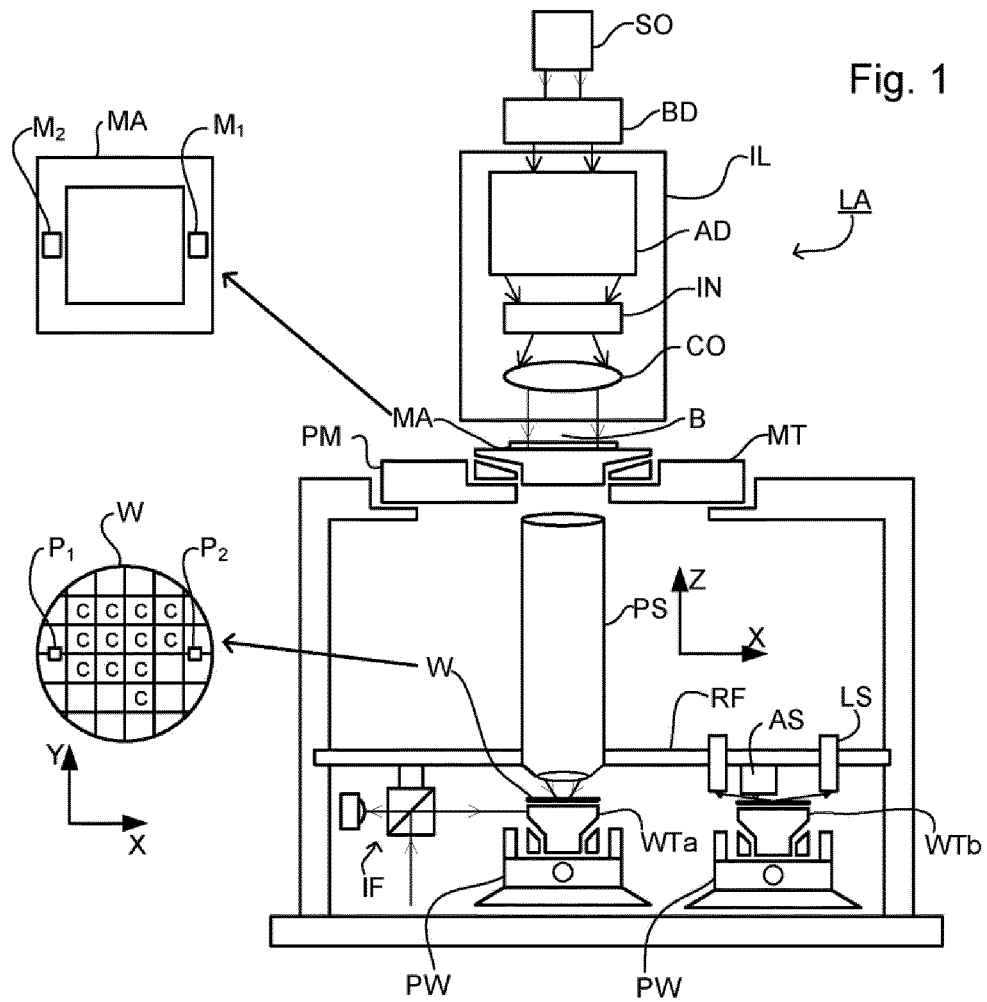
FIG. 1 depicts an embodiment of a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
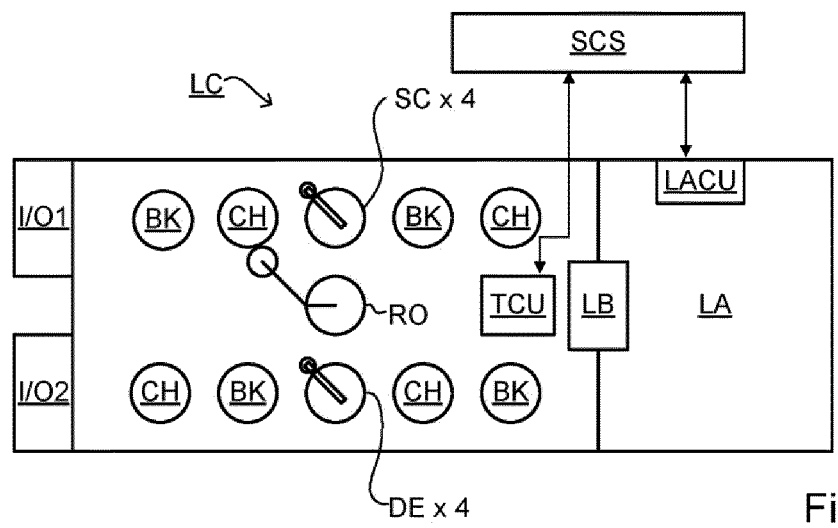
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
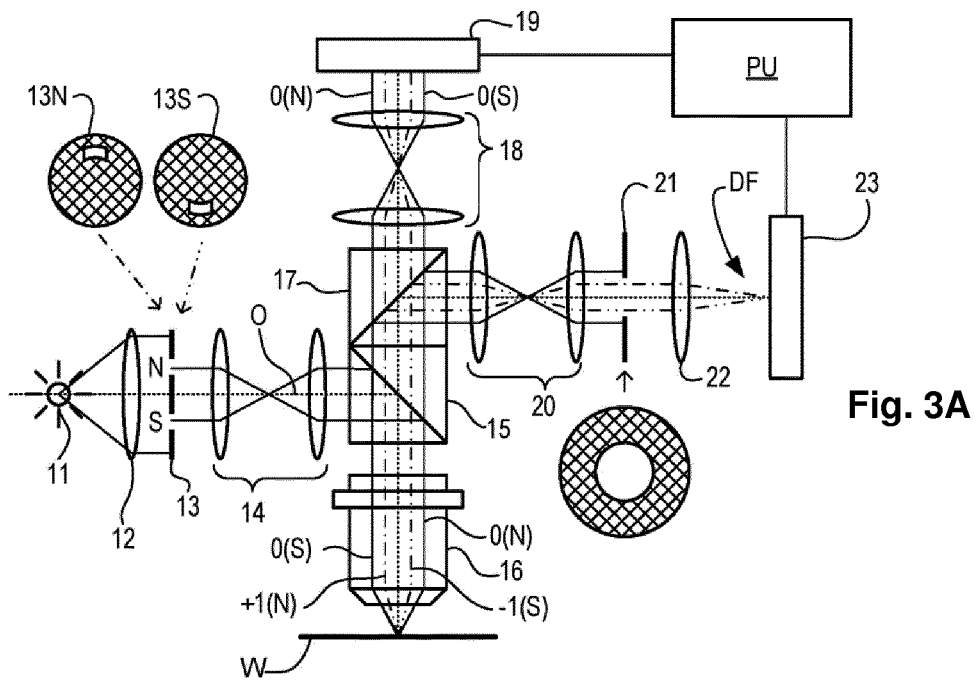
FIG. 3A depicts a schematic diagram of an inspection apparatus (e.g., a dark field scatterometer in this case) configured to measure a target using a first pair of illumination apertures.

An inspection apparatus suitable for use in embodiments is shown in FIG. 3A. A target T and diffracted rays of measurement radiation used to illuminate the target are illustrated in more detail in FIG. 3B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 3B, 3C, 3D:
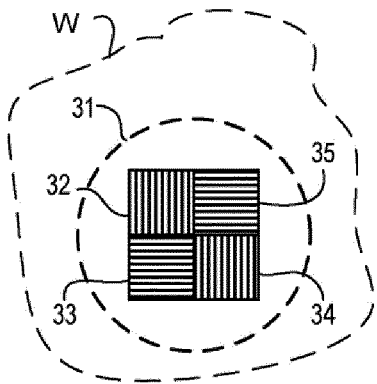
FIG. 3B schematically depicts a detail of a diffraction spectrum of a target periodic structure for a given direction of illumination.
FIG. 3C schematically depicts a second pair of illumination apertures providing further illumination modes in using the inspection apparatus of FIG. 3A for diffraction based measurement.
FIG. 3D schematically depicts a third pair of illumination apertures combining the first and second pair of apertures.

As shown in FIG. 3B, target T is placed with substrate W normal to the optical axis O of objective lens 16. The substrate W may be supported by a support (not shown). A ray of measurement radiation I impinging on target T from an angle off the axis O gives rise to a zeroth order ray (solid line O) and an infinite number of higher order diffracted rays (of which only the $1^{st}$ order are shown as dot-chain line +1 and double dot-chain line −1 in FIG. 3B). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and $+1^{st}$ orders diffracted by the target T on substrate W are collected by objective lens 16 and directed back through optical element 15. Returning to FIG. 3A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction. The pupil plane image for an underfilled target may be used as an input for dose and focus metrology, in accordance with embodiments.

In the second measurement branch, optical system 20, 22 forms an image of the target T on sensor 23 (e.g. a CCD or CMOS sensor). In an embodiment, in the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the $−1^{st}$ and $+1^{st}$ orders is present.

The particular forms of aperture plate 13 and field stop 21 shown in FIG. 3 are purely examples. In an embodiment, on-axis illumination of the targets is used and an aperture stop with an off-axis aperture is used to pass substantially only one first order of diffracted radiation to the sensor (e.g., zeroth order radiation). In yet other embodiments, 2nd, 3rd and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 3C and 3D. The use of these, and numerous other variations and applications of the apparatus are described in the patent application publications mentioned above.

Figures 4, 5:
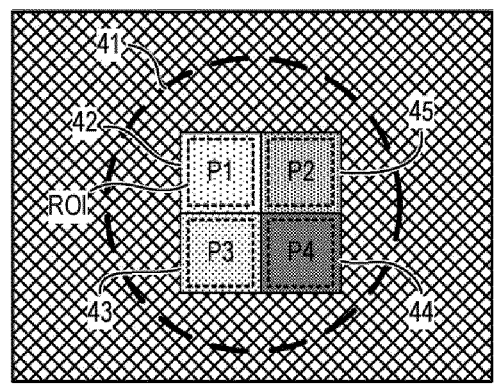
FIG. 4 depicts a form of multiple periodic structure target and an outline of a measurement spot on a substrate.
FIG. 5 depicts an image of the target of FIG. 4 obtained in the inspection apparatus of FIG. 3.

FIG. 4 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an embodiment, the target has a different form. In an embodiment, the target is a non-functional metrology target except for measurement. In an embodiment, the target comprises one or more (device) product features.

In an example dedicated to defocus measurement, periodic structures 32 to 35 are themselves focus-sensitive gratings formed by asymmetric gratings that are patterned in one or more layers (typically a same layer) of, e.g., the semi-conductor device formed on substrate W. For use of a target dedicated to measurement of overlay, periodic structures 32 to 35 are themselves composite periodic structures formed by overlying periodic structures that are patterned in different layers of, e.g., the semi-conductor device formed on substrate W.

Periodic structures 32 to 35 may also differ in their orientation, as shown, so as to diffract incoming radiation in X and Y directions. In one example, periodic structures 32 and 34 are X-direction periodic structures. Periodic structures 33 and 35 are Y-direction periodic structures. Separate images of these periodic structures can be identified in the image captured by sensor 23. This is only one example of a target. A target may comprise more or fewer than 4 periodic structures, or only a single periodic structure.

FIG. 5 shows an example of an image that may be formed on and detected by the sensor 23, using the target of FIG. 4 in the apparatus of FIG. 3, using the aperture plates 13NW or 13SE from FIG. 3D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole. However a desire for accurate alignment remains if the imaging process is subject to non-uniformities across the image field. In an embodiment, four positions P1 to P4 are identified and the periodic structure are aligned as much as possible with these known positions.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process, such as focus, as illustrated in U.S. Patent Application Publication No. US 2011-0027704, which is incorporated by reference herein in its entirety.

Figure 6:
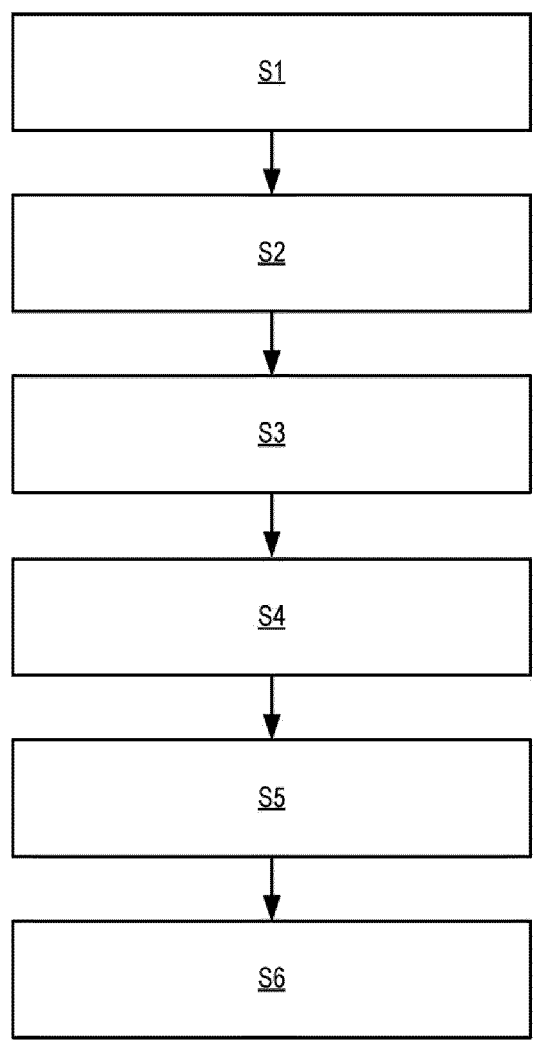
FIG. 6 is a flowchart showing steps of a measurement method using the inspection apparatus of FIG. 3.

FIG. 6 illustrates how a process parameter of interest (such as focus) is measured. At step S1, the substrate, for example a semiconductor wafer, is processed through a lithographic apparatus, such as the lithographic cell of FIG. 2, one or more times, to create a target including, for example, the structures 32-35. At S2, using the inspection apparatus of FIG. 3, an image of at least part of the target is obtained using, e.g., only one of the diffracted orders (say −1 or zero).

In an embodiment, the metrology measurement is done through identifying a target asymmetry, as revealed by comparing the intensities in the $+1^{st}$ order and $-1^{st}$ order dark field images of the target periodic structures (the intensities of other corresponding higher orders can be compared, e.g. $+2^{nd}$ and $-2^{nd}$ orders) to obtain a measure of the intensity asymmetry. In this case, at optional step S3, whether by changing the illumination mode, or changing the imaging mode, or by rotating substrate W by 180° in the field of view of the inspection apparatus, a second image of the periodic structures using another diffracted order (+1) can be obtained; consequently the +1 diffracted radiation is captured in the second image. Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level.

In step S4, a region of interest (ROI) is identified within the image of each component target structure, from which intensity levels will be measured. Having identified the ROI for each individual target structure and measured its intensity, the process parameter of interest (e.g., focus) can then be determined. This is done (e.g., by the processor PU) in step S5 by evaluating the intensity values obtained, e.g., for zeroth, $+1^{st}$ and/or $-1^{st}$ orders for each target structure 32-35 to identify, e.g., their intensity asymmetry (e.g., any difference in their intensity). The term "difference" is not intended to refer only to subtraction. Differences may be calculated in ratio form. In step S6 the evaluated intensity for a number of target structures are used, optionally together with knowledge of any one or more known parameters (e.g., dimensions) of those target structures, to determine or calculate one or more parameters of interest of the patterning process in the vicinity of the target T. In applications described herein, measurements using two or more different measurement recipes may be included.

The process parameter of interest (e.g., overlay, CD, focus, dose, etc.) can be fed back (or fed forward) for improvement of the patterning process, improvement of the target, and/or used to improve the measurement and calculation process of FIG. 6 itself.

In an embodiment, there is provided a metrology technique to counter, for example, on one or more problems with metrology techniques, such as those described herein. In particular, in an embodiment, a differential target design is provided that is sensitive to two or more process parameters of interest (e.g., both dose and defocus).

In an embodiment, the differential target design comprises a change in a pattern (e.g., a product pattern, i.e., a pattern of, or substantially similar to a pattern of, a device product) of a pattern target, such as assist features that are added to, or altered in, the pattern or changes in the optical proximity of the pattern, so that there is a change in sensitivity to, or an offset in, one or more of the process parameters of interest (e.g., focus and dose). Where the process parameters of interest are focus and dose, the change can be an offset or shift in the best focus point (i.e., the point where defocus is zero). This results in shifted Bossung curves that can be picked up by a zeroth order diffraction signal of a metrology system. In an embodiment, the dose sensitivity can be influenced by a change in the pattern; this similarly results in shifted Bossung curves that can be picked up by a zeroth order diffraction signal of a metrology system. As described further below, in an embodiment, the result is a set of three or more targets comprising the pattern target, a first auxiliary target and a second auxiliary target, wherein there is a difference in the sensitivity or an offset, of a process parameter between at least first and second auxiliary targets.

Before describing the details of the technique, some of the principles underlying the technique are outlined. To a first order approximation, a Bossung curve for CD can be parameterized by a function of exposure energy (dose) E and focus F as follows:

$$CD(F, E) = A\left(\frac{E_0}{E} - 1\right)\left(1 + \left(\frac{F - F_0}{\Delta}\right)^2\right) \qquad (1)$$

where A and $E_0$ are calibration constants that relate to the exposure latitude and non-exposing energy respectively, $F_0$ is the best focus point, and $\Delta$ relates to the depth-of-focus. Depending on the characterization of the features (e.g., being two- or three-dimensional (i.e. lines/spaces vs contact holes (CH)), zeroth order diffraction intensity measured in a metrology system scales linearly (for two-dimensional features) or quadratically (for three-dimensional features) with changing CD.

With that background, a pattern target (e.g., comprising a product pattern) can be selected and setup as a target so that it has Bossung curves that are centered around best focus $F_{0,1}$ at a non-exposing energy constant of $E_{0,1}$, and is calibrated such that, at a particular dose of $E^*$, the CD equals a nominal set value $CD^*$. Now, as discussed above and in more detail hereafter, a differential target design can be used to enable a new metrology technique. In an embodiment, the differential target design comprises at least two auxiliary targets that complement the foregoing pattern target. In an embodiment, two auxiliary targets are provided that are designed so that they are centered around best focus $F_{0,2}$ and $F_{0,3}$ respectively such that $F_{0,2}<F_{0,1}<F_{0,3}$ while keeping the depth-of-focus (thus $\Delta$) equal for all targets and such that at $E^*$ and respectively at $F_{0,2}$ and $F_{0,3}$ their CD also equals $CD^*$. Thus, each auxiliary target has a best focus offset from the other and each auxiliary target has a best focus offset from that of the pattern target. This can be achieved by making changes to the pattern of the pattern target to create a first of the auxiliary targets and doing the same again with the pattern of the pattern target to create the second of the auxiliary targets. In an embodiment, those changes involve adding or altering assist features (e.g., scattering bars) to, and/or making optical proximity changes (e.g., adding one or more serifs, changing a width, etc.) of, the pattern of the pattern target to make the first auxiliary target and then doing so again to create the second auxiliary target. An example of such a pattern target and the first and second auxiliary targets is presented below in FIGS. 11A, 11B and 11C respectively. The first and second auxiliary targets can be made using a simulation of the patterning process and tuning the first and second auxiliary target designs to meet the criteria. Additionally or alternatively, experiments with different auxiliary target designs can be performed to select appropriate auxiliary target designs, or to tune the auxiliary target designs, until auxiliary targets are obtained that meet the criteria.

The changes will have as an additional effect that the exposure latitude will slightly differ, which can be modelled by giving the calibration constants $A_2$ and $A_3$ for the auxiliary targets an offset with respect to $A_1$. In this way the Bossung curves for the pattern target, a first auxiliary target, and a second auxiliary target can be written as:

$$CD_1(F, E) = A_1\left(\frac{E_{0,1}}{E} - 1\right)\left(1 + \left(\frac{F - F_{0,1}}{\Delta}\right)^2\right) \quad (2)$$

$$CD_2(F, E) = A_2\left(\frac{E_{0,2}}{E} - 1\right)\left(1 + \left(\frac{F - F_{0,2}}{\Delta}\right)^2\right) \quad (3)$$

$$CD_3(F, E) = A_3\left(\frac{E_{0,3}}{E} - 1\right)\left(1 + \left(\frac{F - F_{0,3}}{\Delta}\right)^2\right) \quad (4)$$

Figure 7A:
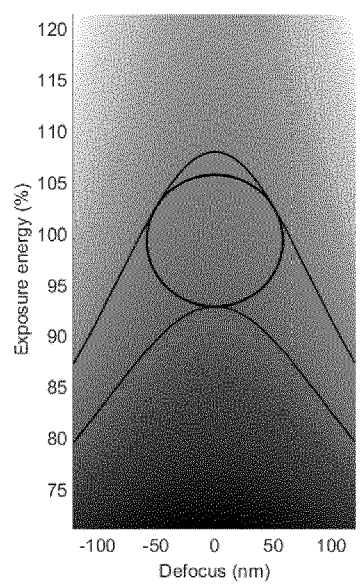
FIGS. 7A, 7B and 7C show example Bossung curves that correspond to a pattern target, a first auxiliary target and a second auxiliary target respectively.
Figure 7B:
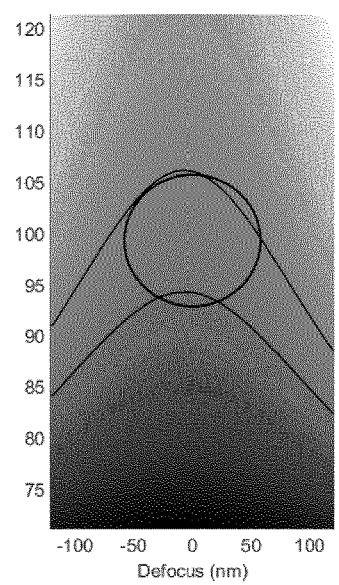
Figure 7C:
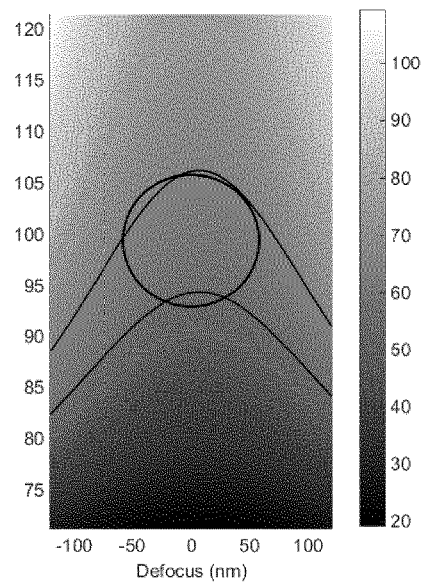

FIGS. 7A, 7B and 7C show example families of Bossung curves calculated using equations (2) to (4), where CD is plotted (in grayscale, where the shades of gray represent different values of CD) against the focus along the horizontal axis (in nm) and the exposure energy along the vertical axis (in % relative to the exposure energy at the best focus). FIG. 7A corresponds to equation (2) for the pattern target, FIG. 7B corresponds to equation (3) for the first auxiliary target, and FIG. 7C corresponds to equation (4) for the second auxiliary target. A process window of $\pm10\%$ $CD^*$ of the pattern of the pattern target is plotted on top of each of graphs of FIGS. 7A, 7B and 7C. The process window is shown as the black ellipse of largest area and encloses the $\pm10\%$ $CD^*$ contours. In this example, the first auxiliary target of FIG. 7B has a shift in best focus of −7 nm relative to the pattern target best focus and the second auxiliary target of FIG. 7C has a shift in best focus of +7 nm relative to the pattern target best focus. The exposure latitude of the auxiliary targets has been reduced with a factor 0.8 with respect to the pattern target. Using these Bossung families, the zeroth diffraction order metrology system signal (average pupil intensity) $I_m$ can be calculated by evaluating $I_m \propto CD^n$ where n=1 for a line/space target and n=2 for a contact hole target.

Now, one can create differential signals from the metrology system signals of the pattern target, the first auxiliary target and the second auxiliary target. The differential signals can be defined as follows:

$$\Delta I_2 = I_1 - I_2 \quad (5)$$

$$\Delta I_3 = I_1 - I_3 \quad (6)$$

where $I_1$ is the pattern target signal, $I_2$ is the first auxiliary target signal, $I_3$ is the second auxiliary target signal.

Figure 8A:
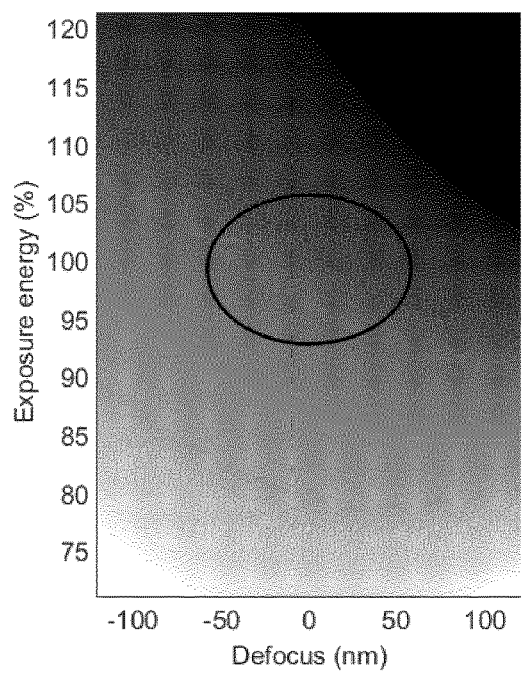
FIGS. 8A and 8B plot an example metrology system signal as composed by taking respectively the difference of the pattern target intensity and the first auxiliary target and the difference of the pattern target intensity and the second auxiliary target.
Figure 8B:
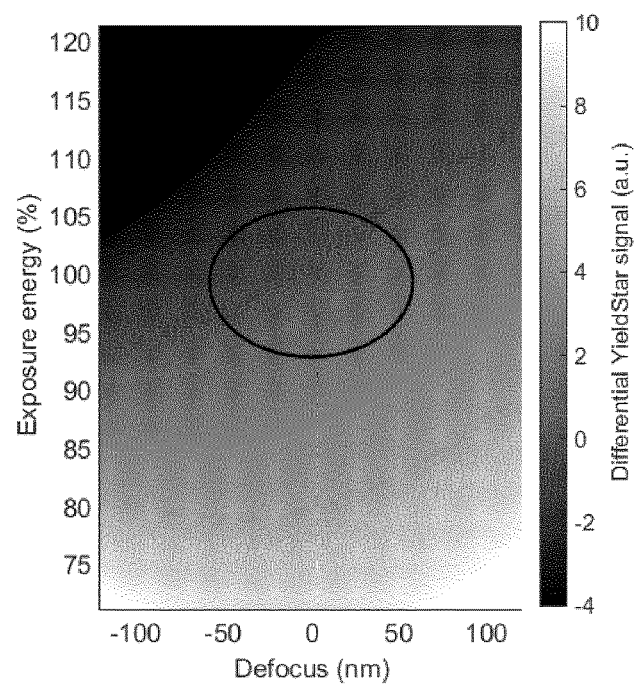

FIGS. 8A and 8B illustrate an example of these differential signals, where the differential signal is plotted (in grayscale, where the shades of gray represent different values of an arbitrary unit) against the focus along the horizontal axis (in nm) and the exposure energy along the vertical axis (in % relative to the exposure energy at the best focus). That is, FIG. 8A plots a metrology system signal as composed by taking the difference of the pattern target intensity and the first auxiliary target as reflected by equation (5). FIG. 8B plots a metrology system signal as composed by taking the difference of the pattern target intensity and the second auxiliary target as reflected by equation (6). A process window of $\pm10\%$ $CD^*$ of the pattern of the pattern target is plotted as a black ellipse on top of each of graphs of FIGS. 8A and 8B. Having regard to FIGS. 8A and 8B, it can be seen that, within the process window of the pattern of the pattern target, the differential signals have an approximate linear evolution that has the same sign for dose variations and an opposite sign for focus variations.

With this insight, additional combinations of these differential signals can be created to decouple the dose and focus drifts within the process window. Thus, a differential signal for the decoupled focus $S_{focus}$ and for the decoupled dose $S_{dose}$ are as follows:

$$S_{focus} = \Delta I_2 - \Delta I_3 \quad (7)$$

$$S_{dose} = \Delta I_2 + \Delta I_3 = 2I_1 - I_2 - I_3 \quad (8)$$

Figure 9A:
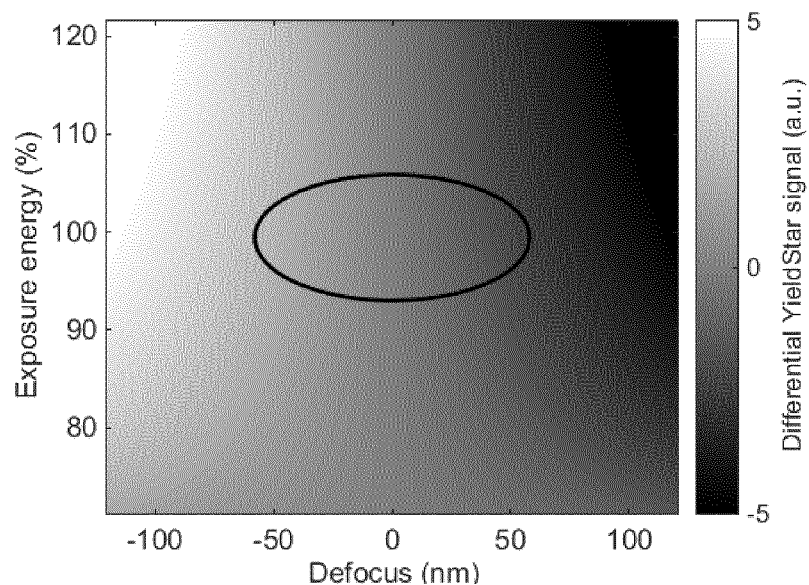
FIGS. 9A and 9B plot an example differential signal for decoupled focus and dose respectively.
Figure 9B:
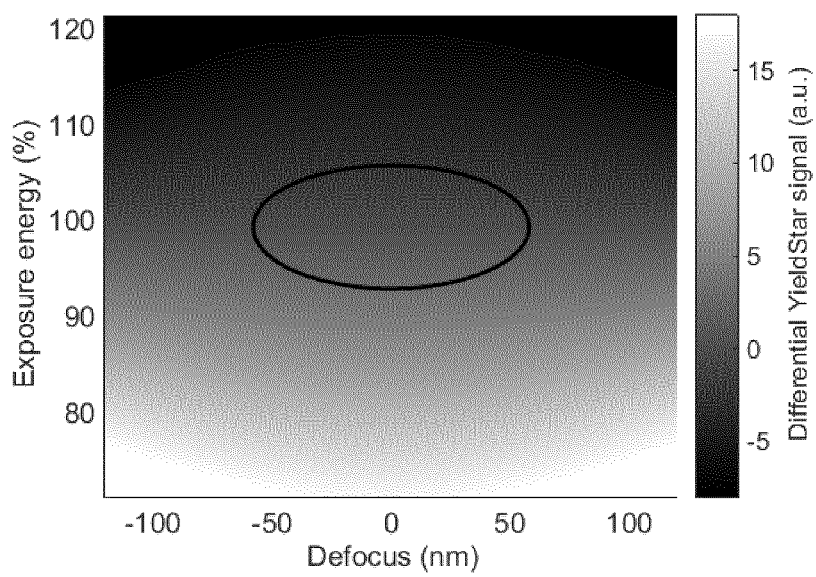

Typical signatures of these signals are shown in FIGS. 9A and 9B, where the differential signal is plotted (in grayscale, where the shades of gray represent different values of an arbitrary unit) against the focus along the horizontal axis (in nm) and the exposure energy along the vertical axis (in % relative to the exposure energy at the best focus). That is, FIG. 9A plots the differential signal of decoupled focus $S_{focus}$ as reflected by equation (7). FIG. 9B plots the differential signal of decoupled dose $S_{dose}$ as reflected by equation (8). A process window of ±10% CD* of the pattern of the pattern target is plotted as a black ellipse on top of each of graphs of FIGS. 9A and 9B. Having regard to FIGS. 9A and 9B, it can be seen that, within the process window of the pattern of the pattern target, the subtracted signals of $S_{focus}$ are predominantly sensitive to focus while the added signals of $S_{dose}$ are predominantly sensitive to dose fluctuations. Thus, FIGS. 9A and 9B show that a decoupling between both focus and dose sensitivity into respectively mainly focus sensitive and dose sensitive signals can be achieved by respectively subtracting and adding the differential signals $\Delta I_2$ and $\Delta I_3$.

Figure 10A:
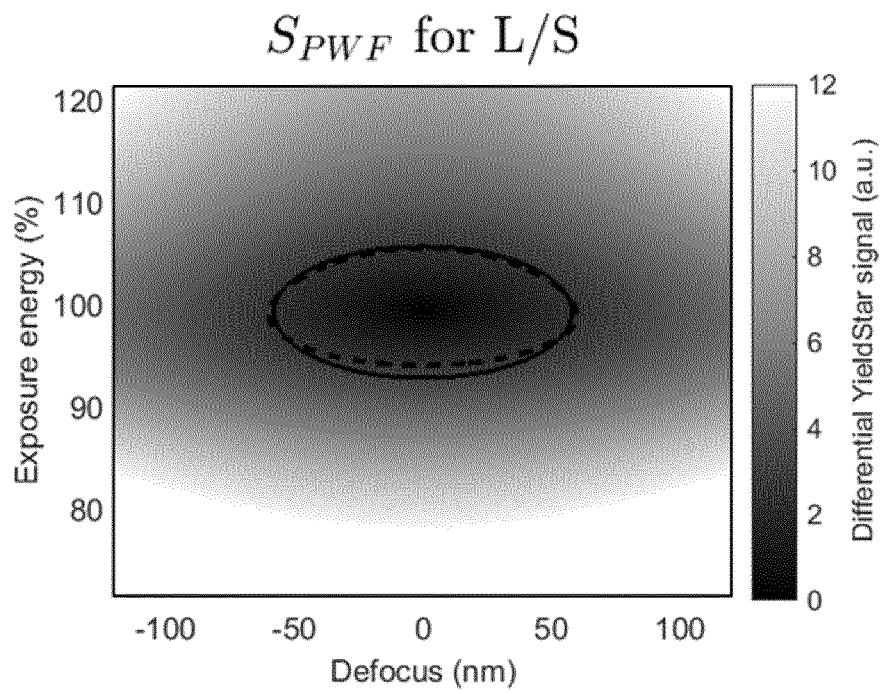
FIGS. 10A and 10B plot an example process window flagging signal based on decoupled focus and dose signals for respectively line/space and contact hole targets.
Figure 10B:
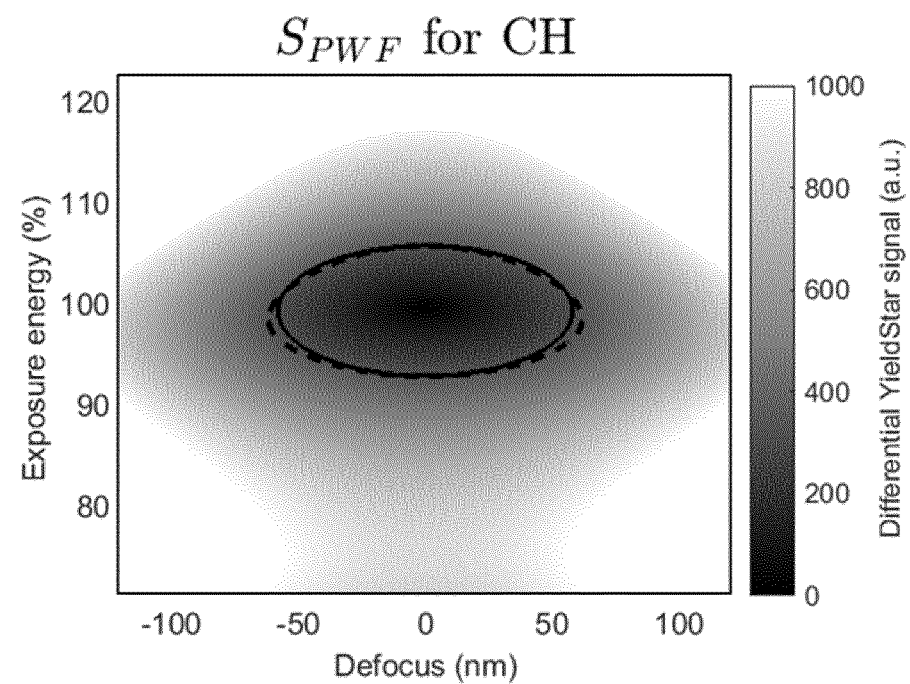

Taking a combination of the differential signals $S_{dose}$ and $S_{focus}$, process window flagging (or monitoring of defect probability), i.e. perform thresholding on the metrology system signal to raise an awareness flag whenever the process drifts away from its tolerable window, can be performed. In an embodiment, the combination can be written as:

$$S_{PWF} = \sqrt{S_{focus}^2 + S_{dose}^2} \tag{9}$$

where $S_{PWF}$ is a process window flagging signal. Thus, in an embodiment, the process window flagging signal is the square root of a combination of a first signal (e.g., signal pertaining to focus) squared and a second signal (e.g., signal pertaining to dose) squared. An example of the process window flagging is shown in FIGS. 10A and 10B using the process window flagging signal of equation (9). FIG. 10A depicts an example plot of the process window flagging signal for an example line/space pattern target according to equation (9), where the process window flagging signal is plotted ((in grayscale, where the shades of gray represent different values of an arbitrary unit) against the focus along the horizontal axis (in nm) and the exposure energy along the vertical axis (in % relative to the exposure energy at the best focus). FIG. 10B depicts an example plot of the process window flagging signal for an example contact hole pattern target according to equation (9). The process window of ±10% CD* of the pattern of the pattern target is plotted as a solid line ellipse on top of each of graphs of FIGS. 10A and 10B. Further, a contour of a constant signal level that best matches the process window is shown as a dashed line ellipse. As can be seen, the topology of the $S_{PWF}$ signal is shaped such that it has a minimum for which the isovalue lines follow to a good extent the process window of the pattern target. Thus, the process window flagging signal provides a good measure of the process conditions of an exposed product target pattern. So, in an embodiment, the process window flagging signal can be a useful means to identify whether a pattern target will be defective or not by determining whether a value of the process window flagging signal of a measured pattern target falls inside or outside the process window determined for the pattern target.

While the generic principles described above apply for ideal changes in CD as a result of drifts in focus and/or dose as explained by equation (1), this metrology technique also is feasible when using a patterning process simulation and a metrology system model (e.g., a pupil model of an optical metrology system using a Jones formalism).

Figure 11A:
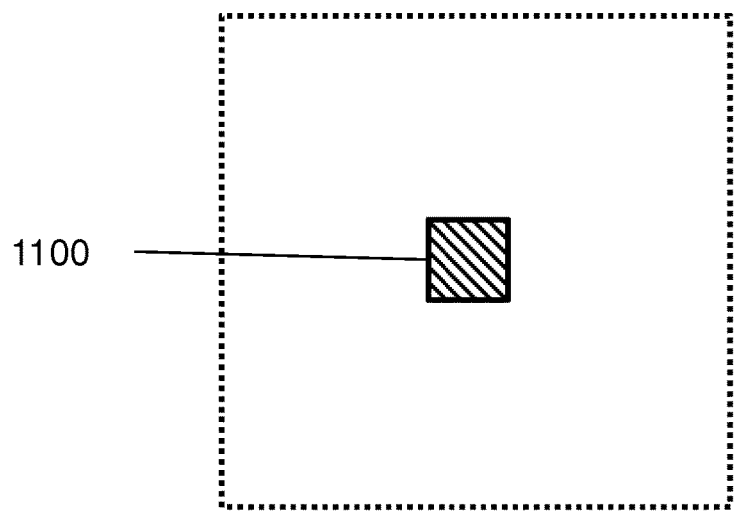
FIG. 11A depicts an example pattern target in the form of a contact hole.
Figure 11B:
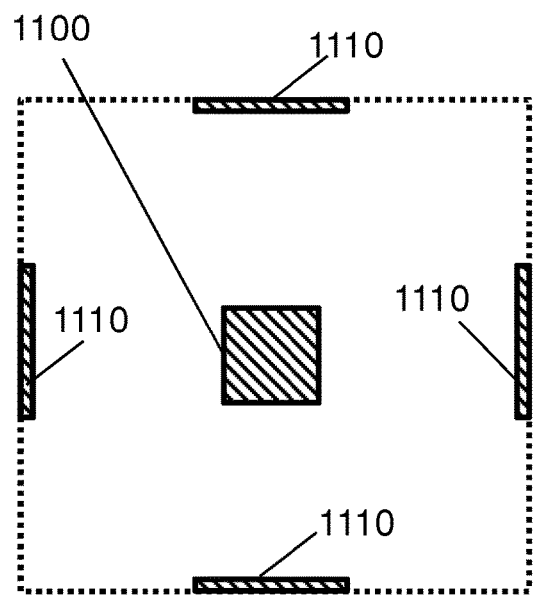
FIG. 11B depicts an example first auxiliary target with the pattern target supplemented by a first arrangement of assist features.
Figure 11C:
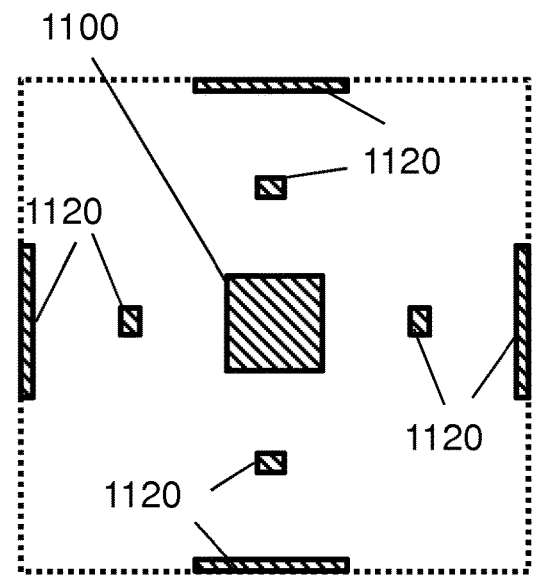
FIG. 11C depicts an example second auxiliary target with the pattern target supplemented by a second arrangement of assist features.

For the simulation, a contact hole pattern target was used. FIG. 11A depicts an example such pattern target in the form of a contact hole 1100. For example, the simulated pattern target can be a single 50 nm circular contact hole in a 300 nm×300 nm unit cell of an attenuated phase shift mask, as is shown in FIG. 11A. FIG. 11B depicts an example first auxiliary target with the pattern target 1100 biased in size and supplemented by a first arrangement of assist features 1110 that enable a shift in the best focus with respect to the pattern target. FIG. 11B depicts an example second auxiliary target with the pattern target 1100 biased in size and supplemented by a second arrangement of assist features 1120 that enable a shift in the best focus with respect to the pattern target. As noted above, the shifts in best focus are different for the first and second auxiliary targets. The assist features introduce a relative shift in best focus of, e.g., between 2-20 nm, between 5-15 nm or around 10 nm, while the amount of bias and the position and dimension of the assist features are arranged (e.g., optimized) such that the resist dimensions on the substrate (e.g., CD) are approximately equal at the dose E* of the product feature, as described above.

Figure 12A:
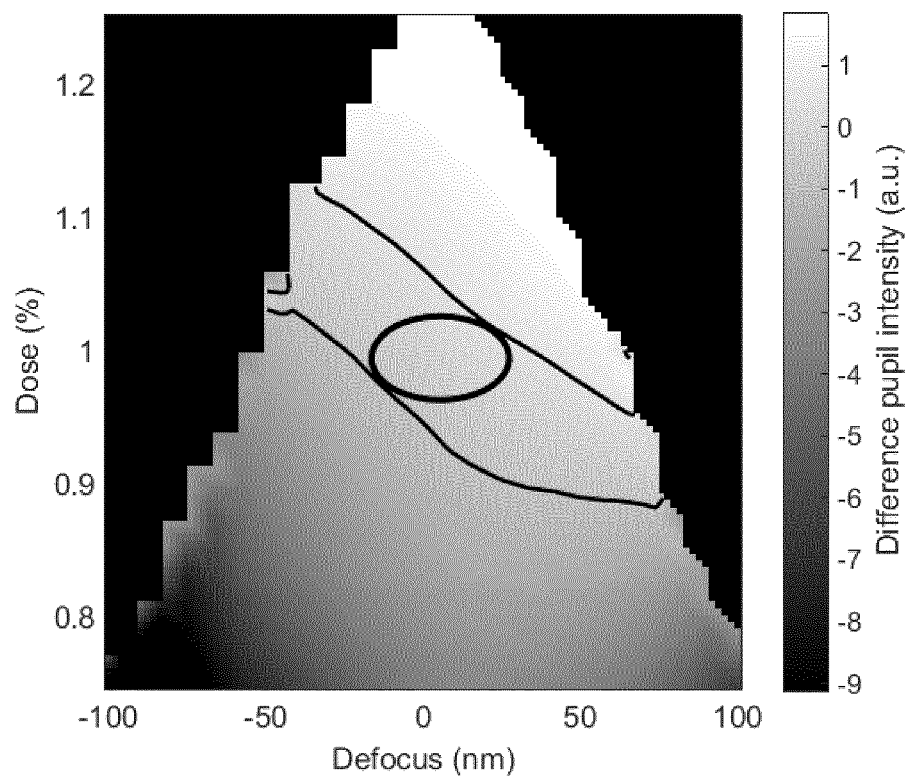
FIGS. 12A and 12B are simulated analogies of FIGS. 8A and 8B.
Figure 12B:
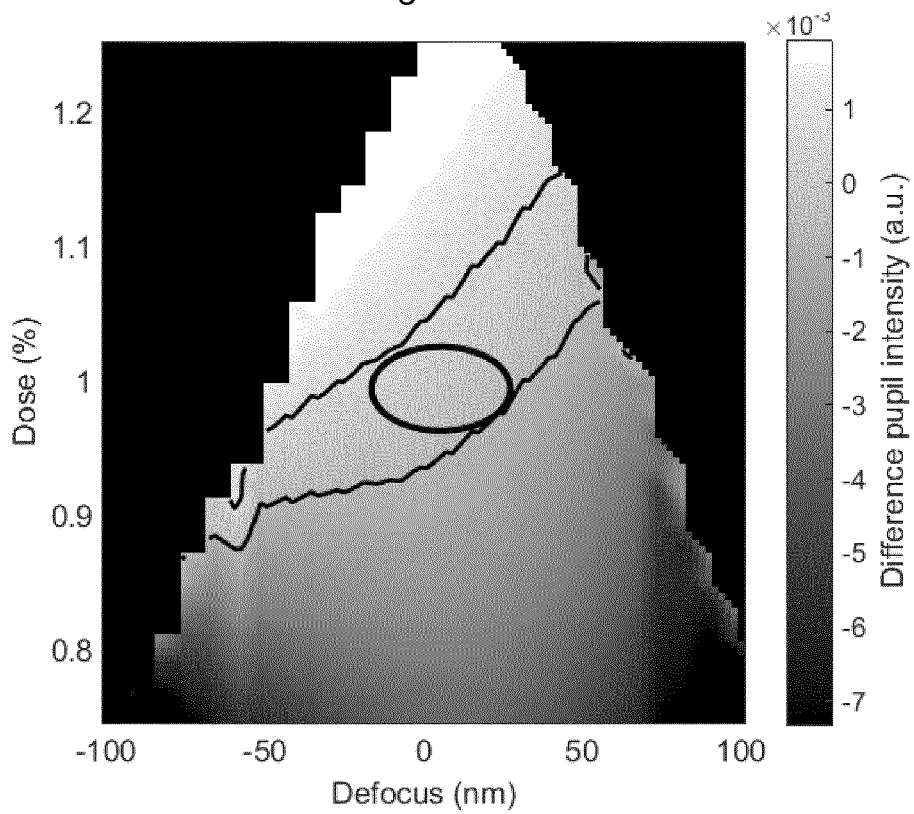

FIGS. 12A and 12B are the simulated analogy of FIGS. 8A and 8B. In particular, FIG. 12A depicts a simulated metrology signal (e.g., average intensity in the pupil plane) as composed by taking the difference of the intensity of the pattern target of FIG. 11A and the intensity of the first auxiliary target of FIG. 11B. FIG. 12B depicts a simulated metrology signal (e.g., average intensity in the pupil plane) as composed by taking the difference of the intensity of the pattern target of FIG. 11A and the intensity of the second auxiliary target of FIG. 11C. The differential signals are plotted (in grayscale, where the shades of gray represent different values of an arbitrary unit) against the focus along the horizontal axis (in nm) and the exposure energy along the vertical axis (in proportion relative to the exposure energy at best focus). The diagonal solid lines are merely markers show the general slope of the shading as better seen in FIGS. 8A and 8B. The process window of ±10% CD* of the pattern of the pattern target is plotted as an ellipse on top of the graph of FIGS. 12A and 12B. As can be seen, FIGS. 12A and 12B compare favorably to FIGS. 8A and 8B.

Figure 13:
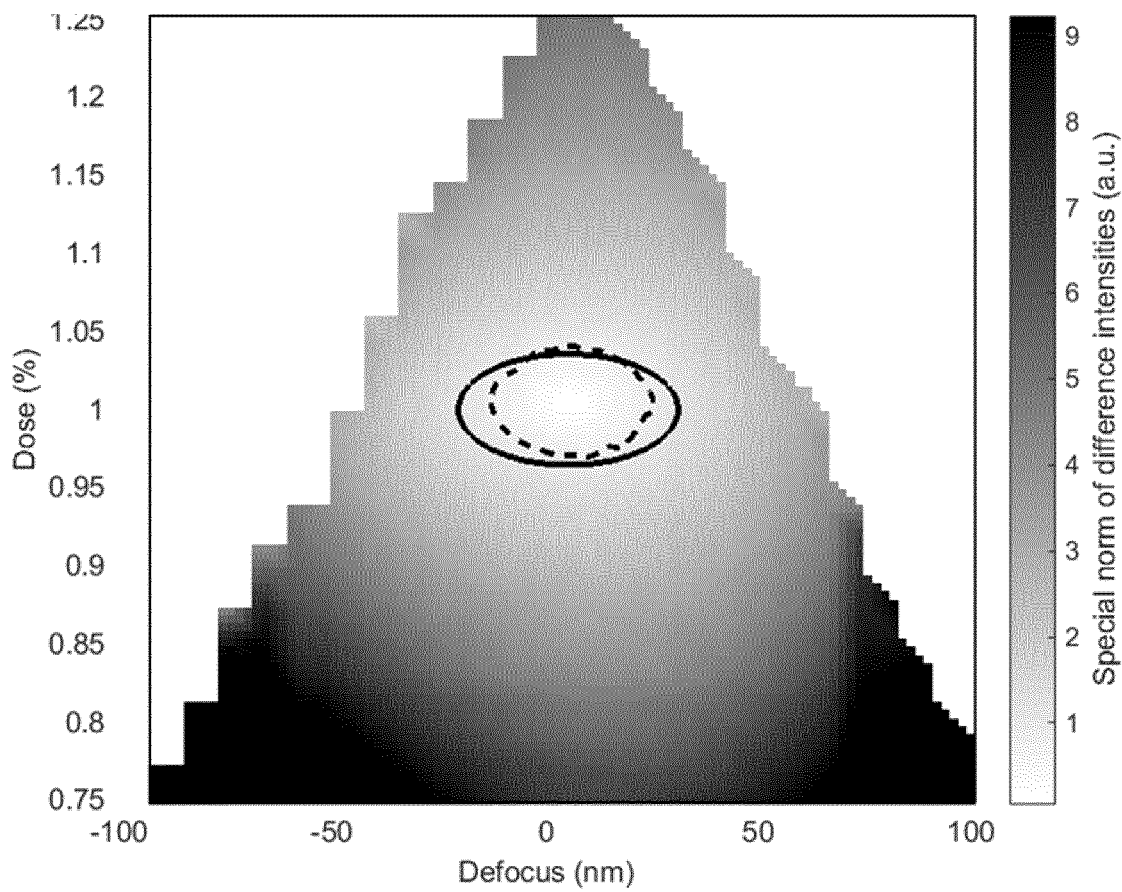
FIG. 13 is a simulated analogy of FIG. 10B.

FIG. 13 is the simulated analogy of FIG. 10B. That is, FIG. 13 depicts an embodiment of plot of the process window flagging signal using equation (9) for the three targets of FIGS. 11A, 11B and 11C, where the process window flagging signal is plotted (in grayscale, where the shades of gray represent different values of an arbitrary unit) against the focus along the horizontal axis (in nm) and the exposure energy along the vertical axis (in proportion relative to the exposure energy at the best focus). The process window of ±10% CD* of the pattern of the pattern target is plotted as a solid line ellipse in a solid line on top of the graph of FIG. 13. Further, a contour of a constant signal level that best matches the process window is shown as a dashed line ellipse. As can be seen, FIG. 13 compares favorably to FIG. 10B.

So, from FIGS. 12A, 12B and 13, it is clear that the addition of assist features is an effective way to design a set of targets with a shift in best focus, which shift enables decoupling of dose and focus variations from a process drift. Further, as is shown in FIG. 13, the signals from the targets can be combined in such a manner that a threshold can be defined on the metrology signal that allows drifts in the process window to be flagged.

Figure 14:
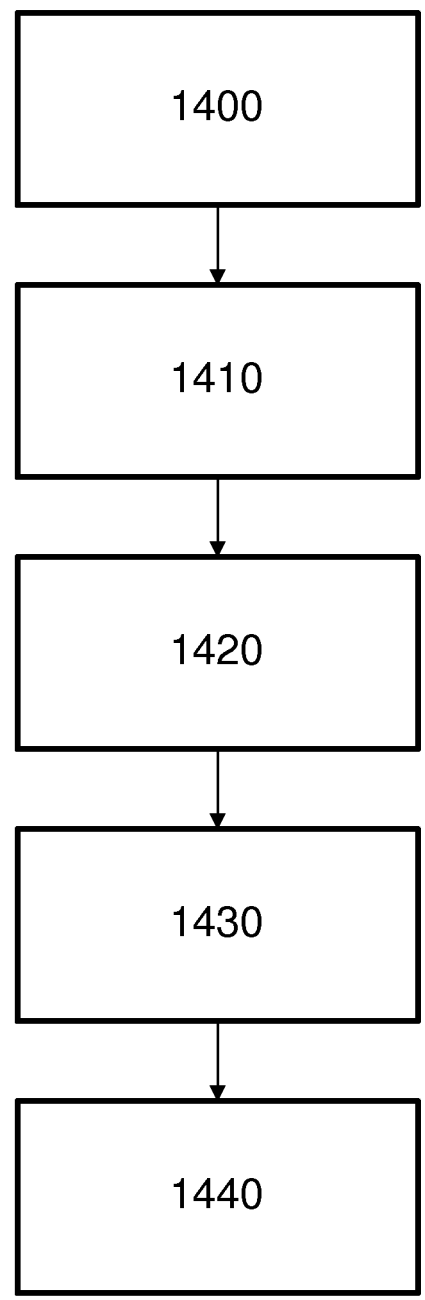
FIG. 14 is a flow chart of an embodiment of a method.

Now, referring to FIG. 14, a method of evaluating a patterning process is described. At 1400, a set of metrology targets are designed to evaluate a patterning process. The set of metrology targets comprises a pattern metrology target, a first auxiliary metrology target and a second auxiliary metrology target. As discussed above, the first and second auxiliary targets are designed to generate a sensitivity difference and/or an offset, of a process parameter (e.g., focus and/or dose) between the first and second auxiliary metrology targets. In an embodiment, each of the first and second auxiliary metrology targets generates a sensitivity difference and/or an offset, of the process parameter relative to the pattern target.

At 1410, a calibration process is performed by which the set of metrology targets are produced in the patterning process at different values of the process parameter as well as different values of one or more other process parameters. In an embodiment, the set of metrology targets are exposed at a range of values of dose and a range of values of focus. The plurality of sets of metrology targets are then measured using, e.g., a measurement apparatus as described herein. In an embodiment, the measurements yield intensity values that can be processed using equations (5)-(8) to generate the set of data plotted in FIGS. 9A and 9B. A process window (as shown in FIGS. 9A and 9B) can then be determined for the set of data.

At 1420, optionally, a process window flagging signal can be generated from the measurements, such as the signal of equation (9). The set of data for the process window flagging as plotted in FIGS. 10A and 10B can be generated using equation (9). A process window (as shown in FIGS. 10A and 10B) can then be determined for the process window flagging set of data.

At 1430, the pattern metrology target or a set of the metrology targets is produced in the patterning process as part of producing a product pattern. For example, the pattern metrology target or a set of metrology targets are produced as part of volume manufacturing of devices. The pattern metrology target or the set of metrology targets is then measured using, e.g., a measurement apparatus as described herein. In an embodiment, where the pattern metrology target is only produced or measured, the corresponding auxiliary targets are measured previously (e.g., at the time of set-up of the lot of substrates) such that their measurements as effectively stored as "virtual' references. Thus, in an embodiment, the relationship of the pattern metrology target to the process window can be estimated by just a measurement of the pattern metrology target (i.e., without having to measure the first and/or second auxiliary target).

In an embodiment, the measurements yield intensity values that can be processed using equations (5)-(8). Then, for example, a value determined from equation (7) can be compared to calibration data as plotted in FIG. 9A to determine whether, for example, the focus is within the process window of FIG. 9A. Similarly, for example, a value determined from equation (8) can be compared to calibration data as plotted in FIG. 9B to determine whether, for example, the dose is within the process window of FIG. 9B. If the values are within the process window, then the patterning process can be considered as operating within the process window and thus operating properly. If the values are outside the process window, then the patterning process may not be operating properly. Optionally, a process window flagging signal can be generated from the measurements, such as the signal of equation (9). Then, for example, a value determined from equation (9) can be compared to calibration data as plotted in FIG. 10A or FIG. 10B to determine whether, for example, the process window flagging signal is within the process window of FIG. 10A or 10B. If the value of the process window flagging signal is within the process window, then the patterning process can be considered as operating within the process window and thus operating properly. If the value of the process window flagging signal is outside the process window, then the patterning process may not be operating properly.

At 1440, one or more actions are taken based on a result from 1430. For example, the result can be used as a basis for controlling metrology, design and/or production processes. For example, the result can be used to predict defects in the manufacture of devices and can be particularly effective if the pattern target is a device pattern expected to be a process window limiting feature (sometimes referred to as a hot-spot). As another example, the result can be used to control or modify the patterning process over time or from run to run. For example, the result can be used to modify one or more parameters of the patterning process (e.g., one or more settings of a lithographic apparatus, of a track device, of an etching tool, one or more design parameters of the patterning process, etc.) with the aim of bringing or maintaining the process within the process window. As another example, the result can identify drifts in focus and/or dose of the patterning process to flag whether the patterning process is drifting outside of the process window for the patterning process and then take appropriate remedial action. In another example, the result can enable patterning process tool matching so that they perform substantially equally (but not necessarily at their respective best). For example, a lithographic apparatus A and a lithographic apparatus B using the same metrology system can be matched, assuming their process window is same, by using a nominal focus/dose that has an offset from lithographic apparatus A to lithographic apparatus B. The result can then give an indication of the difference in performance between lithographic A and lithographic apparatus B and then appropriate correction can be made if the difference crosses a threshold, to the execution of the patterning process on lithographic apparatus A and/or lithographic apparatus B so as to have their performances match to within the threshold. These various checks, modifications and corrections can be automated.

In another example, the result is used (together with other information as may be available), to update a metrology process (e.g., change a metrology recipe such as the measurement beam wavelength or polarization, change the pattern target and/or first auxiliary target and/or second auxiliary target, etc.). The updated metrology process can then be used for re-measurement of the patterning process. In another example, the result can enable metrology tool matching so that they perform substantially equally (but not necessarily at their respective best). For example, a metrology system A and a metrology system B using the same lithographic apparatus can be matched based on the result where a set of measurements are made with metrology system A and a set of measurements are made with metrology system B. For example, assuming a same process window, a nominal focus/dose offset can be provided for metrology targets measured with metrology system A to those measured by metrology system B. The result can then give an indication of the difference in performance between metrology system A and metrology system B and then appropriate correction can be made if the difference crosses a threshold, to the measurement on metrology system A and/or metrology system B (e.g., changing a metrology recipe, changing one or more setup parameters, etc.) so as to have their performances match to within the threshold. These various checks, modifications and corrections can be automated.

While discussion of the shift in the Bossung curve and of the sensitivity difference and/or an offset, of a process parameter of the patterning process between a plurality of metrology targets discussed above has focused on using assist features to do so, the shift, difference or offset can be introduced in a number of ways. For example, in an additional or alternative embodiment, the lithographic apparatus used to print the targets may have a deliberate, controlled astigmatism (e.g., to introduce a best focus offset). The astigmatism may be introduced to the projection optics via one or more manipulators included within the projection system. The projection system manipulator(s) can enable a sufficiently large astigmatism offset to create the shift, difference or offset, without unwanted wavefront effects. In an embodiment, the astigmatism may introduce the shift, difference or offset (e.g. best focus offset) between horizontal and vertical features. To exploit this, the first and second targets may comprise respectively a horizontal grating and a vertical grating (or vice versa).

In an additional or alternative embodiment, a similar effect can be obtained by implementing a difference in the height of patterning device features for the applicable targets. For example, one target can be provided at a normal patterning device level, and another target can be provided at a (desirably adjacent) etched position.

Figure 15A:
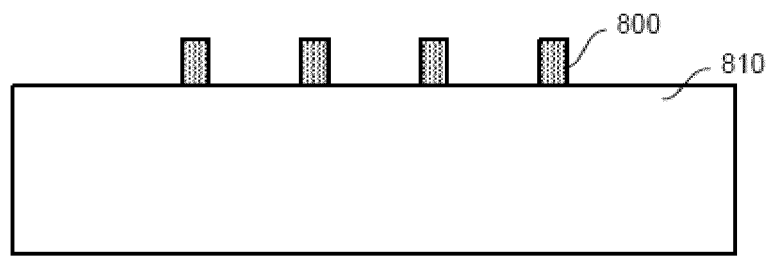
FIGS. 15A, 15B, 15C and 15D show schematically, in cross section, possible target forming arrangements on a patterning device.

FIGS. 15A-15D illustrate a number of target forming arrangements of a patterning device in this regard. FIG. 15A shows, in cross section, a target forming arrangement which may be used to print one of the targets. In this example, the target forming arrangement on the patterning device comprises radiation blocking structures 800 on a transparent patterning device substrate 810. The patterning device may be of any structure or material. For example, the transparent patterning device substrate 810 may comprise quartz, and the radiation blocking structures 800 may comprise chromium, molybdenum silicide (any opacity) or tantalum boron nitride.

Figure 15B:
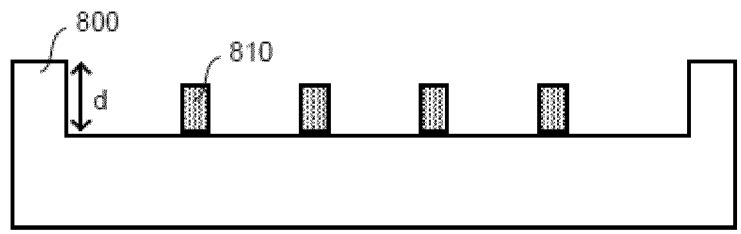
Figure 15C:
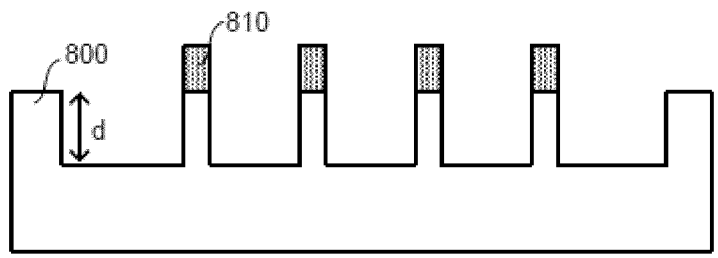
Figure 15D:
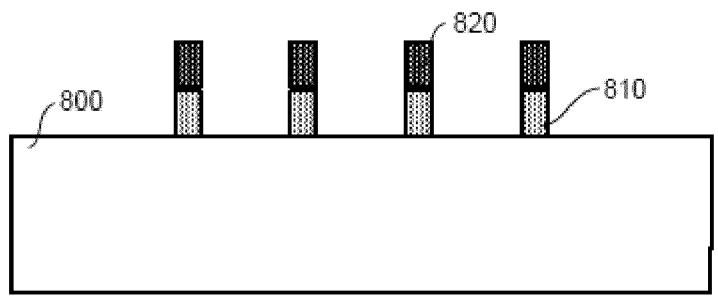

It is proposed that this target is used with one of the target forming arrangements of FIG. 15B, 15C or 15D. However, any combination of any of the target forming arrangements shown in FIG. 15 may be used provided they result in the shift, difference or offset.

FIG. 15B shows a transparent patterning device substrate 810 which, in the region of the target forming arrangement, has been etched to a depth d before the addition of radiation blocking structures 800. Such an arrangement provides a simple target forming arrangement, but manufacture is complicated by not being able to do this in the "mask shop". FIG. 15C shows a target forming arrangement similar to that of FIG. 15A, but where the patterning device substrate 810 has been etched through to a depth d after deposition of the radiation blocking structures 800. FIG. 15D shows a target forming arrangement where the radiation blocking structures 800 are topped with additional metal (e.g., chromium) caps 820. In the etched examples above, the depth d may be for example 0.1 µm or more, more specifically in the region of 0.1 µm to 5 µm, or 0.5 µm to 5 µm, and for example 0.5 µm to 3 µm. In an embodiment, depth d may be in the region of 1 µm.

Figure 16A:
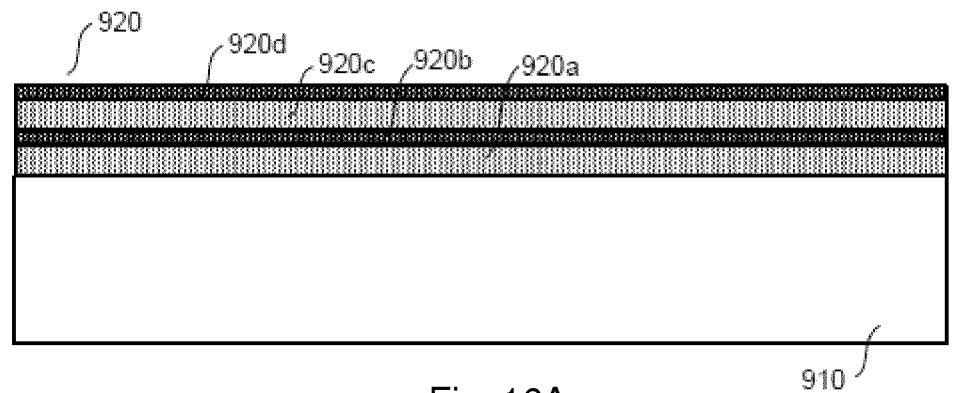
FIG. 16A shows schematically, in cross section, a patterning device blank according to an embodiment
Figure 16B:
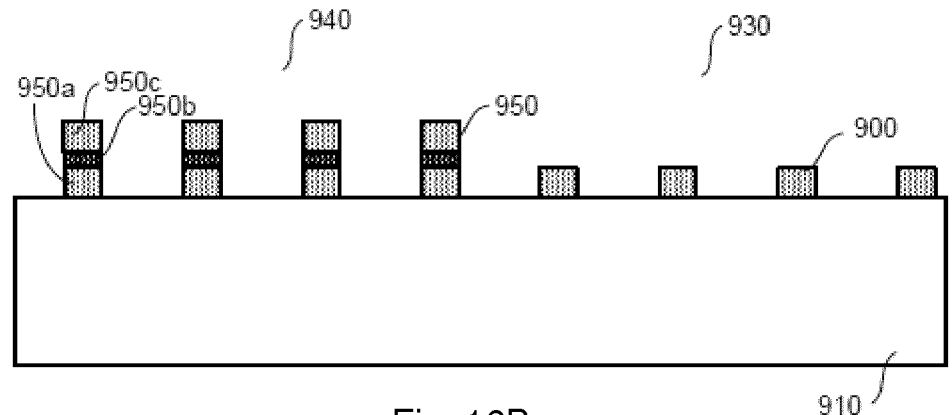
FIG. 16B shows schematically, in cross section, a possible target forming arrangement on a patterning device.

FIGS. 16A and 16B illustrate aspects of a further target forming arrangement for achieving the shift, difference or offset. This arrangement is suited (by way of example) for OMOG (Opaque MoSi on Glass) and for attPSM (attenuated phase-shifting mask) patterning device types. In particular, the trend for attPSM patterning devices is for a reduction in the Cr thickness. This will reduce the Cr topping effect of the FIG. 15D embodiment described above. The patterning device production comprises depositing one (or more) extra absorber stacks on the blank; where the blank comprises the patterning device substrate on which is deposited a single absorber stack. The absorber stack may comprise an opaque layer (e.g., a MoSi layer) topped with a metal layer (e.g., a Cr layer). FIG. 16A shows this patterning device blank. It comprises a patterning device substrate 910 topped with two absorber stacks. A first absorber stack comprises first layer 920a (e.g., a MoSi layer) and second layer 920b (e.g., a Cr layer). The second absorber layer also comprises two layers: third layer 920c (e.g., a MoSi layer) and fourth layer 920d (e.g., a Cr layer).

FIG. 16B shows the final target forming arrangement. It shows first target forming arrangement 930 and second target forming arrangement 940. First target forming arrangement 930 is comprises a single opaque layer (e.g. formed from first layer material 920a) of blocking structures 900. The second target forming arrangement 940 comprises blocking structures 950, each having three layers: a first layer 950a, a second layer 950b and a third layer 950c, formed respectively from first layer material 920a, second layer material 920b and third layer material 920c. The fourth layer 920d is removed completely.

The process for producing such a patterning device may comprise the following steps: 1) Deposit one or more extra absorber stacks on the blank (this may be performed by the provider of the blank); 2) Etch the target layer (containing the target forming arrangements 930, 940) through both stacks to the depth of substrate 910; 3) Remove the extra stack for the first target forming arrangement and its corresponding layer. This layer contains the product and a first target forming arrangement, but not the second or more target forming arrangements. Resist covers the second or more target forming arrangements during this step; and 4) Etch the reference layer in a conventional manner. Resist covers the second or more target forming arrangements during this step.

Figure 17:
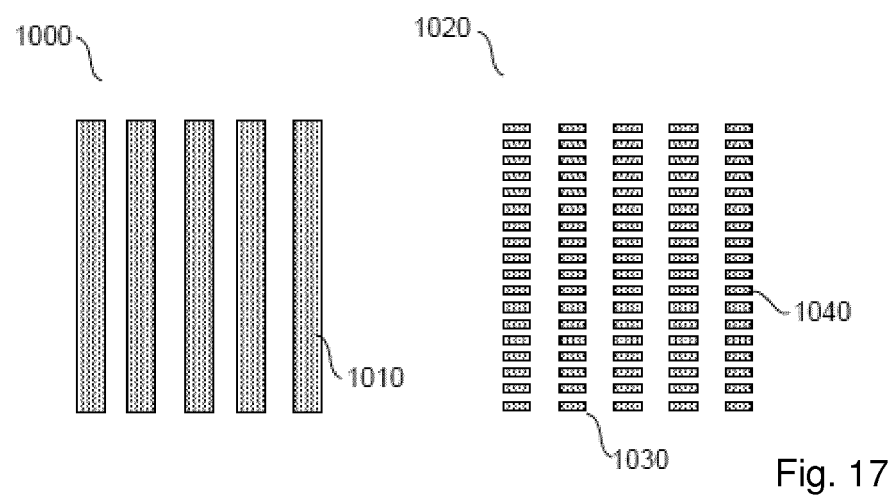
FIG. 17 shows schematically, in plan view, possible target forming arrangements on a patterning device.

A further method of obtaining targets with the shift, difference or offset between them comprises providing a first target comprising a line-space target with a focus insensitive side wall angle (SWA), such that the SWA of the individual structures of the first target is focus insensitive, and a second target with focus sensitive SWA. The second target may comprise a segmented line, the segmentation being sub-resolution with respect to the lithography apparatus. FIG. 17 illustrates a target forming arrangement of a patterning device for producing such first and second targets. The first target forming arrangement 1000 (shown in part) comprises a line-space arrangement having structures 1010 which produce corresponding target structures on a substrate with a SWA that is focus insensitive. In an embodiment, the SWA is small (i.e., close to vertical). The second target forming arrangement 1020 (shown in part) comprises a line-space arrangement having segmented line structures 1030. The segmented line structures 1030 comprise high resolution substructures 1040. The second target forming arrangement 1020 is such that the resulting target exposed on a substrate has a focus dependent SWA.

The first target forming arrangement 1000 and second target forming arrangement 1020 each have a target parameter response with focus which describe Bossung curves having a best focus offset. This best focus offset is as a result of the focus dependent SWA of only one of the targets. The SWA varies linearly with focus, which causes the shift in the Bossung peak.

An advantage of introducing the shift, difference or offset by means of the structure of the patterning device (rather than via astigmatism in the projection system) is this allows both on-product and off-product parameter monitoring. Having astigmatism in the projection system means that such methods likely can only be used for off-product monitoring.

Thus, in an embodiment, there is provided a differential target design that is sensitive to both dose and focus. So, in an embodiment, a combination of focus and dose inference in a single metrology methodology is provided. In an embodiment, the differential target design provides an intentional shift in Bossung curves (e.g., best focus shift) by the addition of one or more assist features or optical proximity correction to pattern for, e.g., an attenuated phase shift mask. The one or more assist features and/or optical proximity correction is used to cause a change in sensitivity in, or an offset of, focus and/or dose. In an embodiment, the pattern is a product pattern of a device pattern. Then, using the measurement results of the differential target design, it can be determined whether, for example, one or more parameters of the patterning process are drifting outside the process window for the patterning process. Appropriate action (e.g., process control, process re-design, etc.) can then be taken based on the measurement results.

In an embodiment, there is provided a method of evaluating a patterning process, the method comprising: obtaining the result of a first measurement of a first metrology target; obtaining the result of a second measurement of a second metrology target, the second metrology target having a structural difference from the first metrology target that generates a sensitivity difference and/or an offset, of a process parameter of the patterning process between the first and second metrology targets; and determining, by a computer system, a value pertaining to the patterning process based on the results of the first and second measurements.

In an embodiment, the determining derives as the value a first signal representative of the process parameter that is effectively decoupled from variation of another process parameter, and a second signal representative of the other process parameter that is effectively decoupled from variation of the process parameter. In an embodiment, the determining further comprises deriving a process window flagging signal based on the first and second signals. In an embodiment, the method further comprises comparing the determined value against a process window threshold to determine whether the patterning process is operating properly or not. In an embodiment, the determining the value pertaining to the patterning process is based on a difference between the results of the first and second measurements. In an embodiment, the first and second metrology targets generate a sensitivity difference and/or an offset, of the process parameter relative to a third metrology target. In an embodiment, the determining is further based on the result of a third measurement of the third metrology target. In an embodiment, the determining is based on a combination of the results of the first, second and third measurements. In an embodiment, the measurement results comprise, or are derived from, an intensity and/or ellipticity signal values from an optical metrology system. In an embodiment, the measurement results comprise, or are derived from, signal values from a diffraction-based metrology system. In an embodiment, the process parameter comprises focus or dose of a patterning step of the patterning process. In an embodiment, the structural difference is created using an optical proximity correction on a patterning device and/or is an assist feature on the patterning device. In an embodiment, the first metrology target and the second metrology target are based on a common product pattern of a pattern of, or for forming, a device.

In an embodiment, there is provided a method of evaluating a patterning process, the method comprising: obtaining a result of measurement of a pattern target; determining, by a computer system, a value pertaining to the patterning process based on a combination of the result of the measurement of the pattern target with a result of measurement of a first auxiliary metrology target and a result of measurement of a second auxiliary metrology target, the second auxiliary metrology target having a structural difference from the first auxiliary metrology target that generates a sensitivity difference and/or an offset, of a process parameter of the patterning process between the first and second auxiliary metrology targets.

In an embodiment, the determining the value pertaining to the patterning process derives as the value a first signal representative of the process parameter that is effectively decoupled from variation of another process parameter, and a second signal representative of the other process parameter that is effectively decoupled from variation of the process parameter. In an embodiment, the determining the value pertaining to the patterning process further comprises deriving a process window flagging signal based on the first and second signals. In an embodiment, the method further comprises comparing the determined value against a process window threshold to determine whether the patterning process is operating properly or not. In an embodiment, the measurement results comprise, or are derived from, an intensity and/or ellipticity signal values from an optical metrology system. In an embodiment, the measurement results comprise, or are derived from, signal values from a diffraction-based metrology system. In an embodiment, the process parameter comprises focus or dose of a patterning step of the patterning process. In an embodiment, the structural difference is created using an optical proximity correction on a patterning device and/or is an assist feature on the patterning device. In an embodiment, the first auxiliary target and the second auxiliary target are based on the pattern target. In an embodiment, the pattern target is a pattern of, or for forming, a device.

In an embodiment, there is provided a method of generating a set of metrology targets to evaluate a patterning process, the method comprising: obtaining a pattern target; and generating, by a computer system, a first metrology target from the pattern target, the first metrology target having a structural difference from the pattern target that generates a sensitivity difference and/or an offset, of a process parameter of the patterning process between the pattern target and the first metrology target such that a Bossung curve measured for the first metrology target is shifted from a Bossung curve measured for the pattern target.

In an embodiment, the method further comprises generating, by a computer system, a second metrology target, the second metrology target having a structural difference from the pattern target and the first metrology target that generates a sensitivity difference and/or an offset, of a process parameter of the patterning process between the second metrology target and both the pattern target and the first metrology target such that a Bossung curve measured for the second metrology target is shifted from a Bossung curve measured for the pattern target and the first metrology target respectively. In an embodiment, the method further comprises: obtaining the result of a first measurement of the pattern target; obtaining the result of a second measurement of the second metrology target; and determining a value pertaining to the patterning process based on the results of the first and second measurements. In an embodiment, the process parameter comprises focus or dose of a patterning step of the patterning process. In an embodiment, the pattern target is a pattern of, or for forming, a device. In an embodiment, the process parameter is focus of a patterning step of the patterning process and wherein the first metrology target has a best focus different than that for the pattern target while the pattern target and the first metrology target have substantially equal depth of focus and, at a substantially equal dose, the first metrology target at its best focus and the pattern target at its best focus have substantially equal critical dimension.

In an embodiment, there is provided a set of metrology targets to evaluate a patterning process, the set of metrology targets comprising a first metrology target and a second metrology target, a difference between the first metrology target and the second metrology target generating a sensitivity difference and/or an offset, of a process parameter of the patterning process between the first and second metrology targets.

In an embodiment, the first and second metrology targets generate a sensitivity difference and/or an offset, of the process parameter relative to a third metrology target. In an embodiment, the first metrology target and the second metrology target are based on a common product pattern of a device pattern. In an embodiment, the difference is generated using an optical proximity correction and/or an assist feature using an optical proximity correction on a patterning device and/or is an assist feature on the patterning device. In an embodiment, the process parameter comprises focus or dose of a patterning step of the patterning process.

While embodiments of the metrology target described herein have mostly been described in the terms of focus and dose measurement, embodiments of the metrology target described herein may be used to measure one or more additional or alternative patterning process parameters. Further, while embodiments have been described mostly in terms of intensity measurements, one or more other optical parameters can be used, such as ellipticity.

The target structures described above can be metrology targets specifically designed and formed for the purposes of measurement. But, advantageously, the pattern target may a functional part of a device formed on the substrate. The term "target", "grating" of a target or "periodic structure" of a target as used herein does not require that the applicable structure has been provided specifically for the measurement being performed.

In association with the physical structures of the targets as realized on substrates and patterning devices, an embodiment may include a computer program containing one or more sequences of machine-readable instructions and/or functional data describing the target design, describing a method of designing a target for a substrate, describing a method of producing a target on a substrate, describing a method of measuring a target on a substrate and/or describing a method of analyzing a measurement to obtain information about a patterning process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing inspection apparatus, for example of the type shown in FIG. 3, is already in production and/or in use, an embodiment can be implemented by the provision of an updated computer program product for causing a processor to perform one or more of the methods described herein. The program may optionally be arranged to control the optical system, substrate support and the like to perform a method of measuring a parameter of the patterning process on a suitable plurality of targets. The program can update the lithographic and/or metrology recipe for measurement of further substrates. The program may be arranged to control (directly or indirectly) the lithographic apparatus for the patterning and processing of further substrates.

Further, embodiments have been described herein in relation to use in a diffraction-based metrology system. However, embodiments herein may be applied, with appropriate modification where needed, to image-based metrology.

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implanted in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

The embodiments may further be described using the following clauses:

1. A method of evaluating a patterning process, the method comprising:

obtaining the result of a first measurement of a first metrology target;

obtaining the result of a second measurement of a second metrology target, the second metrology target having a structural difference from the first metrology target that generates a sensitivity difference and/or an offset, of a process parameter of the patterning process between the first and second metrology targets; and determining, by a computer system, a value pertaining to the patterning process based on the results of the first and second measurements.

2. The method of clause 1, wherein the determining derives as the value a first signal representative of the process parameter that is effectively decoupled from variation of another process parameter, and a second signal representative of the other process parameter that is effectively decoupled from variation of the process parameter.

3. The method of clause 2, wherein the determining further comprises deriving a process window flagging signal based on the first and second signals.

4. The method of any of clauses 1 to 3, further comprising comparing the determined value against a process window threshold to determine whether the patterning process is operating properly or not.

5. The method of any of clauses 1 to 4, wherein the determining the value pertaining to the patterning process is based on a difference between the results of the first and second measurements.

6. The method of any of clauses 1 to 5, wherein the first and second metrology targets generate a sensitivity difference and/or an offset, of the process parameter relative to a third metrology target.

7. The method of clause 6, wherein the determining is further based on the result of a third measurement of the third metrology target.

8. The method of clause 7, wherein the determining is based on a combination of the results of the first, second and third measurements.

9. The method of any of clauses 1 to 8, wherein the measurement results comprise, or are derived from, an intensity and/or ellipticity signal values from an optical metrology system.

10. The method of any of clauses 1 to 9, wherein the measurement results comprise, or are derived from, signal values from a diffraction-based metrology system.

11. The method of any of clauses 1 to 10, wherein the process parameter comprises focus or dose of a patterning step of the patterning process.

12. The method of any of clauses 1 to 11, wherein the structural difference is created using an optical proximity correction on a patterning device and/or is an assist feature on the patterning device.

13. The method of any of clauses 1 to 12, wherein the first metrology target and the second metrology target are based on a common product pattern of a pattern of, or for forming, a device.

14. A method of evaluating a patterning process, the method comprising:
obtaining a result of measurement of a pattern target;
determining, by a computer system, a value pertaining to the patterning process based on a combination of the result of the measurement of the pattern target with a result of measurement of a first auxiliary metrology target and a result of measurement of a second auxiliary metrology target, the second auxiliary metrology target having a structural difference from the first auxiliary metrology target that generates a sensitivity difference and/or an offset, of a process parameter of the patterning process between the first and second auxiliary metrology targets.

15. The method of clause 14, wherein the determining the value pertaining to the patterning process derives as the value a first signal representative of the process parameter that is effectively decoupled from variation of another process parameter, and a second signal representative of the other process parameter that is effectively decoupled from variation of the process parameter.

16. The method of clause 15, wherein the determining the value pertaining to the patterning process further comprises deriving a process window flagging signal based on the first and second signals.

17. The method of any of clauses 14 to 16, further comprising comparing the determined value against a process window threshold to determine whether the patterning process is operating properly or not.

18. The method of any of clauses 14 to 17, wherein the measurement results comprise, or are derived from, an intensity and/or ellipticity signal values from an optical metrology system.

19. The method of any of clauses 14 to 18, wherein the measurement results comprise, or are derived from, signal values from a diffraction-based metrology system.

20. The method of any of clauses 14 to 19, wherein the process parameter comprises focus or dose of a patterning step of the patterning process.

21. The method of any of clauses 14 to 20, wherein the structural difference is created using an optical proximity correction on a patterning device and/or is an assist feature on the patterning device.

22. The method of any of clauses 14 to 21, wherein the first auxiliary target and the second auxiliary target are based on the pattern target.

23. The method of any of clauses 14 to 22, wherein the pattern target is a pattern of, or for forming, a device.

24. A method of generating a set of metrology targets to evaluate a patterning process, the method comprising:
obtaining a pattern target; and
generating, by a computer system, a first metrology target from the pattern target, the first metrology target having a structural difference from the pattern target that generates a sensitivity difference and/or an offset, of a process parameter of the patterning process between the pattern target and the first metrology target such that a Bossung curve measured for the first metrology target is shifted from a Bossung curve measured for the pattern target.

25. The method of clause 24, further comprising generating, by a computer system, a second metrology target, the second metrology target having a structural difference from the pattern target and the first metrology target that generates a sensitivity difference and/or an offset, of a process parameter of the patterning process between the second metrology target and both the pattern target and the first metrology target such that a Bossung curve measured for the second metrology target is shifted from a Bossung curve measured for the pattern target and the first metrology target respectively.

26. The method of clause 24 or clause 25, further comprising:
obtaining the result of a first measurement of the pattern target;
obtaining the result of a second measurement of the second metrology target; and
determining a value pertaining to the patterning process based on the results of the first and second measurements.

27. The method of any of clauses 24 to 26, wherein the process parameter comprises focus or dose of a patterning step of the patterning process.

28. The method of any of clauses 24 to 27, wherein the pattern target is a pattern of, or for forming, a device.

29. The method of any of clauses 24 to 28, wherein the process parameter is focus of a patterning step of the patterning process and wherein the first metrology target has a best focus different than that for the pattern target while the pattern target and the first metrology target have substantially equal depth of focus and, at a substantially equal dose, the first metrology target at its best focus and the pattern target at its best focus have substantially equal critical dimension.

30. A set of metrology targets to evaluate a patterning process, the set of metrology targets comprising a first metrology target and a second metrology target, a difference between the first metrology target and the second metrology target generating a sensitivity difference and/or an offset, of a process parameter of the patterning process between the first and second metrology targets.

31. The set of metrology targets of clause 30, wherein the first and second metrology targets generate a sensitivity difference and/or an offset, of the process parameter relative to a third metrology target.

32. The set of metrology targets of clause 30 or clause 31, wherein the first metrology target and the second metrology target are based on a common product pattern of a device pattern.

33. The set of metrology targets of any of clauses 30 to 32, wherein the difference is generated using an optical proximity correction and/or an assist feature using an optical proximity correction on a patterning device and/or is an assist feature on the patterning device.

34. The set of metrology targets of any of clauses 30 to 33, wherein the process parameter comprises focus or dose of a patterning step of the patterning process.

35. A metrology apparatus for measuring a parameter of a patterning process, the metrology apparatus being operable to perform the method of any of clauses 1 to 29.

36. A non-transitory computer program product comprising machine-readable instructions for causing a processor to cause performance of the method of any of clauses 1 to 29.

37. A system comprising: an inspection apparatus configured to provide a beam of radiation on a metrology target and to detect radiation redirected by the target to determine a parameter of a patterning process; and the non-transitory computer program product of clause 36.

38. The system of clause 37, further comprising a lithographic apparatus comprising a support structure configured to hold a patterning device to modulate a radiation beam and a projection optical system arranged to project the modulated radiation beam onto a radiation-sensitive substrate.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm), extreme ultra-violet (EUV) radiation (e.g., having a wavelength in the range of 5-20 nm) and soft x-ray (e.g., having a wavelength around 1 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of evaluating a patterning process, the method comprising:
    obtaining a result of a first measurement of a first metrology target;
    obtaining a result of a second measurement of a second metrology target, the second metrology target having a structural difference from the first metrology target that generates a sensitivity difference and/or an offset, of a process parameter of the patterning process between the first and second metrology targets; and
    determining, by a hardware computer system, a value pertaining to the patterning process based on the results of the first and second measurements.

2. The method of claim 1, wherein the determining derives as the value a first signal representative of the process parameter that is effectively decoupled from variation of another process parameter, and a second signal representative of the other process parameter that is effectively decoupled from variation of the process parameter.

3. The method of claim 2, wherein the determining further comprises deriving a process window flagging signal based on the first and second signals.

4. The method of claim 1, further comprising comparing the determined value against a process window threshold to determine whether the patterning process is operating properly or not.

5. The method of claim 1, wherein the determining the value pertaining to the patterning process is based on a difference between the results of the first and second measurements.

6. The method of claim 1, wherein the first and second metrology targets generate a sensitivity difference and/or an offset, of the process parameter relative to a third metrology target.

7. The method of claim 6, wherein the determining is further based on the result of a third measurement of the third metrology target.

8. The method of claim 7, wherein the determining is based on a combination of the results of the first, second and third measurements.

9. The method of claim 1, wherein the measurement results comprise, or are derived from, an intensity and/or ellipticity signal value from an optical metrology system.

10. The method of claim 1, wherein the measurement results comprise, or are derived from, signal values from a diffraction-based metrology system.

11. The method of claim 1, wherein the process parameter comprises focus or dose of a patterning step of the patterning process.

12. The method of claim 1, wherein the structural difference is created using an optical proximity correction on a patterning device and/or is an assist feature on the patterning device.

13. The method of claim 1, wherein the first metrology target and the second metrology target are based on a common product pattern of a pattern of, or for forming, a device.

14. A non-transitory computer program product comprising machine-readable instructions that, when executed, are configured to cause for causing a processor system to cause at least:

obtain a result of a first measurement of a first metrology target;

obtain a result of a second measurement of a second metrology target, the second metrology target having a structural difference from the first metrology target that generates a sensitivity difference and/or an offset, of a process parameter of a patterning process between the first and second metrology targets; and determine a value pertaining to the patterning process based on the results of the first and second measurements.

15. A method of evaluating a patterning process, the method comprising:

obtaining a result of measurement of a pattern target;

determining, by a hardware computer system, a value pertaining to the patterning process based on a combination of the result of the measurement of the pattern target with a result of measurement of a first auxiliary metrology target and a result of measurement of a second auxiliary metrology target, the second auxiliary metrology target having a structural difference from the first auxiliary metrology target that generates a sensitivity difference and/or an offset, of a process parameter of the patterning process between the first and second auxiliary metrology targets.

16. The method of claim 15, wherein the determining the value pertaining to the patterning process derives as the value a first signal representative of the process parameter that is effectively decoupled from variation of another process parameter, and a second signal representative of the other process parameter that is effectively decoupled from variation of the process parameter.

17. The method of claim 16, wherein the determining the value pertaining to the patterning process further comprises deriving a process window flagging signal based on the first and second signals.

18. The method of claim 15, further comprising comparing the determined value against a process window threshold to determine whether the patterning process is operating properly or not.

19. The method of claim 15, wherein the first auxiliary target and the second auxiliary target are based on the pattern target.

20. The method of claim 15, wherein the pattern target is a pattern of, or for forming, a device.

21. A non-transitory computer program product comprising machine-readable instructions that, when executed, are configured to cause for causing a processor system to cause at least:

obtain a result of measurement of a pattern target;

determine a value pertaining to the patterning process based on a combination of the result of the measurement of the pattern target with a result of measurement of a first auxiliary metrology target and a result of measurement of a second auxiliary metrology target, the second auxiliary metrology target having a structural difference from the first auxiliary metrology target that generates a sensitivity difference and/or an offset, of a process parameter of the patterning process between the first and second auxiliary metrology targets.

* * * * *